United States Patent
Katare et al.

(10) Patent No.: US 9,882,565 B2
(45) Date of Patent: Jan. 30, 2018

(54) BUFFER CIRCUIT AND ELECTRIC SYSTEM INCLUDING THE SAME

(71) Applicant: SAMSUNG ELECTRONICS CO., LTD., Suwon-si, Gyeonggi-Do (KR)

(72) Inventors: Siddharth Katare, Hwaseong-si (KR); Jeong-Don Ihm, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/141,050

(22) Filed: Apr. 28, 2016

(65) Prior Publication Data

US 2017/0047925 A1   Feb. 16, 2017

(30) Foreign Application Priority Data

Aug. 13, 2015  (KR) .................. 10-2015-0114324

(51) Int. Cl.
 H03K 19/0185 (2006.01)

(52) U.S. Cl.
 CPC ................ H03K 19/018521 (2013.01)

(58) Field of Classification Search
 CPC .... H03K 17/00; H03K 17/6872; H03K 19/00; H03K 19/00361; H03K 19/00384; H03K 19/018521; H04L 25/0272; H04L 25/00; H04L 25/028
 USPC ........................................... 327/108
 See application file for complete search history.

(56) References Cited

U.S. PATENT DOCUMENTS

| | | | |
|---|---|---|---|
| 5,666,068 A | * | 9/1997 | Ehmann ......... H03K 19/018528 326/63 |
| 6,344,651 B1 | * | 2/2002 | Woolaway .............. G01J 5/24 250/332 |
| 6,456,122 B1 | | 9/2002 | Park et al. |
| 6,784,700 B1 | | 8/2004 | Hunt et al. |
| 7,057,445 B2 | | 6/2006 | Hayakawa |
| 7,248,081 B2 | | 7/2007 | Mohammadi et al. |
| 2002/0021149 A1 | | 2/2002 | Park et al. |
| 2004/0155689 A1 | | 8/2004 | Kumar et al. |
| 2007/0046373 A1 | | 3/2007 | Staples et al. |
| 2007/0257712 A1 | | 11/2007 | Einerman et al. |
| 2010/0039142 A1 | | 2/2010 | Lee et al. |
| 2010/0079431 A1 | | 4/2010 | Tsai et al. |

(Continued)

*Primary Examiner* — Lincoln Donovan
*Assistant Examiner* — David Mattison
(74) *Attorney, Agent, or Firm* — F. Chau & Associates, LLC

(57) ABSTRACT

A buffer circuit includes first and second current generators, a comparator, a differential driver, and an inverter. The first current generator outputs a first current corresponding to a reference voltage. The second current generator generates a limit current corresponding to an input limit voltage, and outputs a second current having a size equal to about half of the limit current. The sizes of the first current and the limit current are controlled by the feedback voltage. The comparator generates the feedback voltage by comparing the first and second currents. The differential driver generates an internal current, and controls the internal current based on the feedback voltage. The magnitudes of an upper limit value and a lower limit value of the internal current are substantially equal to each other with respect to a reference value. The inverter generates an output current by inverting the internal current based on supply voltage.

20 Claims, 11 Drawing Sheets

(56) References Cited

U.S. PATENT DOCUMENTS

| | | |
|---|---|---|
| 2013/0127536 A1 | 5/2013 | Cavallaro et al. |
| 2013/0187703 A1 | 7/2013 | Amirabadi |
| 2014/0266322 A1* | 9/2014 | Wang .................. H03K 17/163 |
| | | 327/108 |

* cited by examiner

BUFFER CIRCUIT AND ELECTRIC SYSTEM INCLUDING THE SAME

CROSS-REFERENCE TO RELATED APPLICATIONS

This application claims priority under 35 U.S.C. § 119 to Korean Patent Application No. 10-2015-0114324, filed on Aug. 13, 2015, the disclosure of which is incorporated by reference herein in its entirety.

TECHNICAL FIELD

Exemplary embodiments of the inventive concept relate generally to a buffer circuit, and more particularly, to a buffer circuit having improved output current characteristic and an electric system including the buffer circuit.

DISCUSSION OF THE RELATED ART

In general, because the pull-up current driving power of a PMOS transistor is different from the pull-down current driving power at a low supply voltage in a buffer circuit including a differential driver, a duty cycle of the buffer circuit deteriorates.

SUMMARY

Exemplary embodiments of the inventive concept provide a buffer circuit having a pull-up current driving power that is substantially the same as a pull-down current driving power irrespective of the size of a supply voltage such that the duty cycle of an output current signal is maintained at about 50%.

Exemplary embodiments of the inventive concept provide an electric system including a buffer circuit having a pull-up current driving power that is substantially the same as a pull-down current driving power irrespective of the size of a supply voltage such that the duty cycle of the output current signal is maintained at about 50%.

According to an exemplary embodiment of the inventive concept, a buffer circuit includes a first current generator, a second current generator, a comparator, a differential driver, and an inverter. The first current generator outputs a first current corresponding to a reference voltage. The size of the first current is controlled by a feedback voltage. The second current generator generates a limit current corresponding to an input limit voltage. The size of the limit current is controlled by the feedback voltage. The second current generator outputs a second current which is about half of the limit current. The comparator generates the feedback voltage by comparing the first and second currents. The differential driver generates an internal current by comparing an input voltage signal and the reference voltage. The differential driver controls the internal current based on the feedback voltage such that an upper limit value of the internal current and the lower limit value of the internal current are symmetric with respect to 0. The inverter generates an output current by inverting the internal current based on a supply voltage.

In an exemplary embodiment, the input voltage signal may vary between a ground voltage and the input limit voltage.

In an exemplary embodiment, the first and second current generators may output the first and second currents which are proportional to the feedback voltage respectively.

In an exemplary embodiment, when the first current is larger than the second current, the comparator may increase the feedback voltage until the first and second current generators generate the first and second currents to be substantially the same size.

In an exemplary embodiment, when the first current is smaller than the second current, the comparator may decrease the feedback voltage until the first and second current generators generate the first and second currents to be substantially same size.

In an exemplary embodiment, the differential driver may generate the internal current having the lower limit value when the input voltage signal having the input limit voltage is larger than the reference voltage. The differential driver may generate the internal current having the upper limit value when the input voltage signal having a ground voltage is smaller than the reference voltage.

In an exemplary embodiment, an absolute value of the upper limit value may be about the same as an absolute value of the lower limit value.

In an exemplary embodiment, the first current generator may include a first PMOS transistor, a second PMOS transistor, a first NMOS transistor, and a second NMOS transistor. A source of the first PMOS transistor may receive a supply voltage, a gate of the first PMOS transistor may be connected to a first node, and a drain of the first PMOS transistor may output the first current. A source of the second PMOS transistor may receive the supply voltage, a gate of the second PMOS transistor may be connected to the first node, and a drain of the second PMOS transistor may be connected to the first node. A drain of the first NMOS transistor may be connected to the first node, a gate of the first NMOS transistor may receive the reference voltage, and a source of the first NMOS transistor may be connected to a second node. A drain of the second NMOS transistor may be connected to the second node, a gate of the second NMOS transistor may receive the feedback voltage, and a source of the second NMOS transistor may receive a ground voltage.

In an exemplary embodiment, the size of the first PMOS transistor may be substantially the same as the size of the second PMOS transistor.

In an exemplary embodiment, the second current generator may include a first PMOS transistor, a second PMOS transistor, a first NMOS transistor, and a second NMOS transistor. A source of the first PMOS transistor may receive a supply voltage, a gate of the first PMOS transistor may be connected to a first node, and a drain of the first PMOS transistor may output the second current. A source of the second PMOS transistor may receive the supply voltage, a gate of the second PMOS transistor may be connected to the first node, and a drain of the second PMOS transistor may be connected to the first node. A drain of the first NMOS transistor may be connected to the first node, a gate of the first NMOS transistor may receive the input limit voltage, a source of the first NMOS transistor may be connected to a second node, and the limit current flows from the drain of the first NMOS transistor to the source of the first NMOS transistor. A drain of the second NMOS transistor may be connected to the second node, a gate of the second NMOS transistor may receive the feedback voltage, and a source of the second NMOS transistor may receive a ground voltage.

In an exemplary embodiment, the size of the first PMOS transistor may be about half of the size of the second PMOS transistor.

In an exemplary embodiment, the comparator may include first and second NMOS transistors. The second current may be provided to a first node. A drain of the first NMOS transistor may be connected to the first node, a gate of the first NMOS transistor may be connected to the first node, and a source of the first NMOS transistor may receive a ground voltage. The first current may be provided to a second node. A drain of the second NMOS transistor may be connected to the second node, a gate of the second NMOS transistor may be connected to the first node, and a source of the second NMOS transistor may receive the ground voltage. A voltage of the second node may be outputted as the feedback voltage.

In an exemplary embodiment, the differential driver may include a first PMOS transistor, a second PMOS transistor, and first through fourth NMOS transistors. A source of the first PMOS transistor may receive a supply voltage, a gate of the first PMOS transistor may be connected to a first node, and a drain of the first PMOS transistor may be connected to the first node. A drain of the first NMOS transistor may be connected to the first node, a gate of the first NMOS transistor may receive the reference voltage, and a source of the first NMOS transistor may be connected to a second node. A drain of the second NMOS transistor may be connected to the second node, a gate of the second NMOS transistor may receive the feedback voltage, and a source of the second NMOS transistor may receive a ground voltage. A source of the second PMOS transistor may receive a supply voltage, a gate of the second PMOS transistor may be connected to the first node, and a drain of the second PMOS transistor may be connected to a third node. The internal current may be outputted from the third node. A drain of the third NMOS transistor may be connected to the third node, a gate of the third NMOS transistor may receive the input voltage signal, and a source of the third NMOS transistor may be connected to a fourth node. A drain of the fourth NMOS transistor may be connected to the fourth node, a gate of the fourth NMOS transistor may receive the feedback voltage, and a source of the fourth NMOS transistor may receive the ground voltage.

According to an exemplary embodiment of the inventive concept, an electric system includes a signal generator and a receiver. The signal generator generates first through (N)-th input signals (N is a natural number) based on an input limit voltage. The receiver includes first through (N)-th buffers circuit which convert the first through (N)-th input signals to first through (N)-th output current signals based on the input limit voltage and a reference voltage respectively. The (K)-th buffer circuit (K is a natural number equal to or less than N) includes a first current generator, a second current generator, a comparator, a differential driver, and an inverter. The first current generator outputs a first current corresponding to the reference voltage. The size of the first current is controlled by a feedback voltage. The second current generator generates a limit current corresponding to the input limit voltage. The size of the limit current is controlled by the feedback voltage. The second current generator outputs a second current which is about half of the limit current. The comparator generates the feedback voltage by comparing the first and second currents. The differential driver generates an internal current signal by comparing the (K)-th input signal and the reference voltage. The differential driver controls the internal current signal based on the feedback voltage such that an upper limit value of the internal current signal and a lower limit value of the internal current signal are symmetric with respect to 0. The inverter generates the (K)-th output current signal by inverting the internal current signal based on a supply voltage.

In an exemplary embodiment, when the first current is larger than the second current, the comparator may increase the feedback voltage until the first and second current generators generate the first and second currents to be substantially the same size. When the first current is smaller than the second current, the comparator may decrease the feedback voltage until the first and second current generators generate the first and second currents to be substantially the same size.

According to an exemplary embodiment of the inventive concept, a buffer circuit includes a first current generator configured to output a first current corresponding to a reference voltage. A size of the first current is controlled by a feedback voltage. The buffer circuit further includes a second current generator configured to generate a limit current corresponding to an input limit voltage. A size of the limit current is controlled by the feedback voltage, and the second current generator is configured to output a second current having a size equal to about half of the limit current. The buffer circuit further includes a comparator configured to generate the feedback voltage by comparing the first and second currents, and a differential driver configured to generate an internal current by comparing an input voltage signal and the reference voltage, and control the internal current based on the feedback voltage. A magnitude of an upper limit value of the internal current and a magnitude of a lower limit value of the internal current are substantially equal to each other with respect to a reference value. The buffer circuit further includes an inverter configured to generate an output current by inverting the internal current based on a supply voltage. Each of the first and second current generators may include a first PMOS transistor, a second PMOS transistor, a first NMOS transistor, and a second NMOS transistor.

According to an exemplary embodiment of the inventive concept, an electric system includes a signal generator configured to generate first through (N)-th input signals based on an input limit voltage. N is a natural number. The electric system further includes a receiver including first through (N)-th buffer circuits configured to respectively convert the first through (N)-th input signals to first through (N)-th output current signals based on the input limit voltage and a reference voltage. A (K)-th buffer circuit (K is a natural number equal to or less than N) from among the first through (N)-th buffer circuits includes a first current generator configured to output a first current corresponding to the reference voltage. A size of the first current is controlled by a feedback voltage. The (K)-th buffer circuit further includes a second current generator configured to generate a limit current corresponding to the input limit voltage. A size of the limit current is controlled by the feedback voltage, and the second current generator is configured to output a second current having a size equal to about half of the limit current. The (K)-th buffer circuit further includes a comparator configured to generate the feedback voltage by comparing the first and second currents, and a differential driver configured to generate an internal current signal by comparing a (K)-th input signal from among the first through (N)-th input signals and the reference voltage, and control the internal current signal based on the feedback voltage. A magnitude of an upper limit value of the internal current signal and a magnitude of a lower limit value of the internal current signal are substantially equal to each other with respect to a reference value. The (K)-th buffer circuit further includes an inverter configured to generate a (K)-th output current signal from among the first through (N)-th output current signals by inverting the internal current signal based on a supply voltage.

As described above, according to exemplary embodiments, because the pull-up current driving power is about the same as the pull-down current driving power irrespective of the size of a supply voltage in the buffer circuit, the duty cycle of the output current signal is maintained at about 50%, even when a low supply voltage is utilized.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EXEMPLARY EMBODIMENTS

Figure 1:
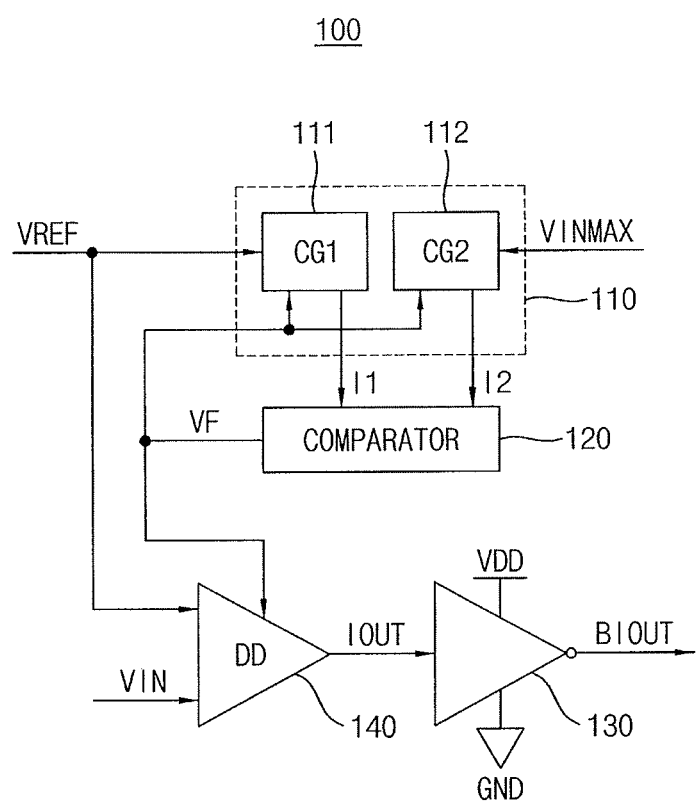
FIG. 1 is a block diagram illustrating a buffer circuit according to an exemplary embodiment of the inventive concept.

Exemplary embodiments of the present inventive concept will be described more fully hereinafter with reference to the accompanying drawings. In the drawings, the sizes and relative sizes of layers and regions may be exaggerated for clarity. Like reference numerals may refer to like elements throughout the accompanying drawings.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept.

It will be understood that when an element is referred to as being "connected" or "coupled" to another element, it can be directly connected or coupled to the other element or intervening elements may be present.

As used herein, the singular forms "a," "an" and "the" are intended to include the plural forms as well, unless the context clearly indicates otherwise.

Herein, when two or more elements or values are described as being substantially the same as or substantially/about equal to each other, it is to be understood that the elements or values are identical to each other, indistinguishable from each other, or distinguishable from each other but functionally the same as each other as would be understood by a person having ordinary skill in the art. Further, when one value is described as being about equal to or the same as another value, it is to be understood that the values are equal to each other to within a measurement enor, or if measurably unequal, are close enough in value to be functionally equal to each other as would be understood by a person having ordinary skill in the art. Similarly, when one value is described as being about half of another value, it is to be understood that the one value is about half of the another value within a measurement error as would be understood by a person having ordinary skill in the art FIG. 1 is a block diagram illustrating a buffer circuit according to an exemplary embodiment of the inventive concept.

Referring to FIG. 1, a buffer circuit 100 includes a current generator 110, a comparator 120, a differential driver DD 140, and an inverter 130. The current generator 110 includes a first current generator 111 and a second current generator 112. Each of these elements may be embodied, for example, as a circuit(s).

The first current generator 111 outputs a first current I1 corresponding to a reference voltage VREF. The size (e.g., the amount of current) of the first current I1 is controlled by a feedback voltage VF. The second current generator 112 generates a limit current corresponding to an input limit voltage VINMAX. The size (e.g., the amount of current) of the limit current is controlled by the feedback voltage VF. The second current generator 112 outputs a second current I2, which is about half of the limit current. The first and second current generators 111 and 112 may output the first and second currents I1 and I2, which are proportional to the feedback voltage VF respectively. In an exemplary embodiment, a proportional relationship between the feedback voltage VF and the first current I1 in the first current generator 111 may be different from a proportional relationship between the feedback voltage VF and the second current I2 in the second current generator 112. The current generator 110 will be described with reference to FIG. 2.

The comparator 120 generates the feedback voltage VF by comparing the first and second currents I1 and I2. In an exemplary embodiment, when the first current I1 is larger than the second current I2, the comparator 120 may increase the feedback voltage VF until the first and second current generators 111 and 112 generate the first and second currents I1 and I2 to be substantially the same as each other (e.g., until the values of the first and second currents I1 and I2 about equal to each other). In an exemplary embodiment, when the first current I1 is smaller than the second current I2, the comparator 120 may decrease the feedback voltage VF until the first and second current generators 111 and 112 generate the first and second currents I1 and I2 to be substantially the same as each other (e.g., until the values of the first and second currents I1 and I2 are about equal to each other). The comparator 120 will be described with reference to FIG. 3.

Figure 7:
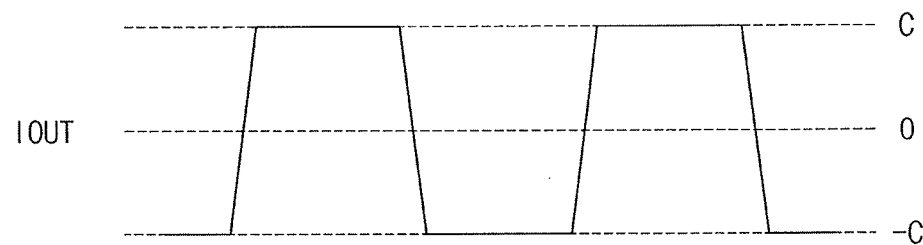
FIG. 7 is a timing diagram illustrating the internal current of the differential driver of FIG. 4 after the feedback voltage increases, according to an exemplary embodiment of the inventive concept.

The differential driver 140 generates an internal current IOUT by comparing an input voltage signal VIN and the reference voltage VREF. The differential driver 140 controls the internal current IOUT based on the feedback voltage VF such that an upper limit value of the internal current IOUT and a lower limit value of the internal current IOUT are symmetric with respect to 0 (see, e.g., FIGS. 7 and 10). That is, in an exemplary embodiment, under the control of the differential driver 140 and based on the feedback voltage VF, a magnitude of the upper limit value of the internal current IOUT and a magnitude of the lower limit value of the internal current IOUT are substantially equal to each other with respect to a reference value (e.g., the reference value may be about 0 amps). For example, as shown in FIG. 7, when the magnitude of the upper limit value of the internal current IOUT is C, the magnitude of the lower limit value of the internal current IOUT is −C. In an exemplary embodiment, an absolute value of the upper limit value may be substantially the same as an absolute value of the lower limit value. The differential driver 140 will be described with reference to FIG. 4.

The inverter 130 generates an output current BIOUT by inverting the internal current IOUT based on a supply voltage VDD.

Figure 2:
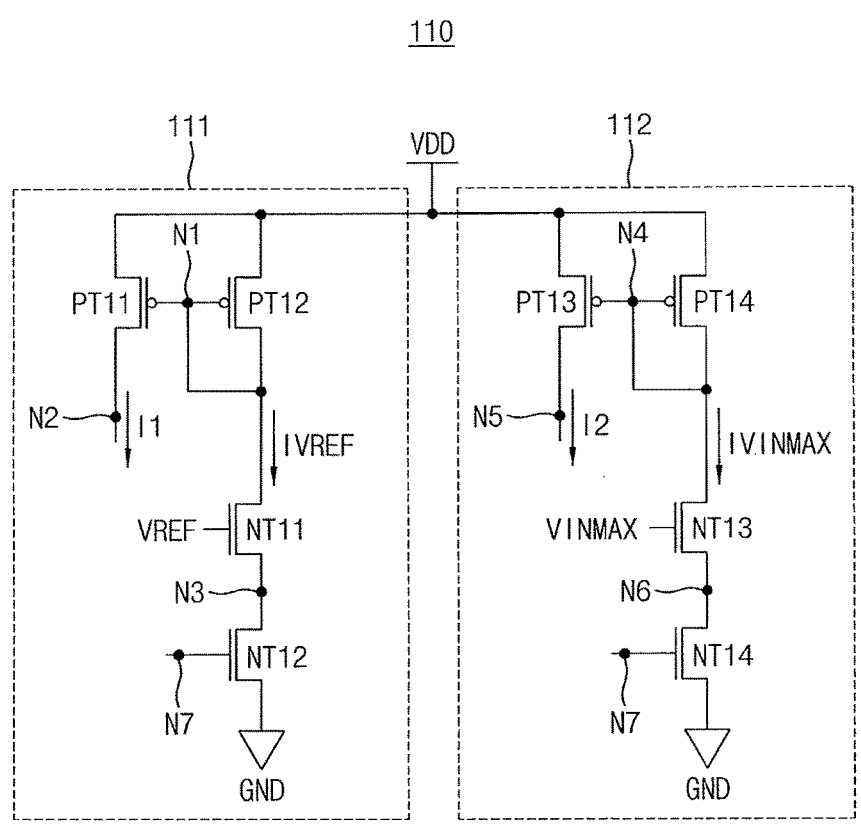
FIG. 2 is a circuit diagram illustrating the current generator included in the buffer circuit of FIG. 1 according to an exemplary embodiment of the inventive concept.

FIG. 2 is a circuit diagram illustrating the current generator included in the buffer circuit of FIG. 1 according to an exemplary embodiment of the inventive concept.

Referring to FIG. 2, the current generator 110 includes the first current generator 111 and the second current generator 112.

The first current generator 111 may include a first p-type metal-oxide semiconductor (PMOS) transistor PT11, a second PMOS transistor PT12, a first n-type metal-oxide semiconductor (NMOS) transistor NT11, and a second NMOS transistor NT12.

A source of the first PMOS transistor PT11 may receive a supply voltage VDD, a gate of the first PMOS transistor PT11 may be connected to a first node N1, a drain of the first PMOS transistor PT11 may be connected to a second node N2, and the drain of the first PMOS transistor PT11 may output the first current I1. A source of the second PMOS transistor PT12 may receive the supply voltage VDD, a gate of the second PMOS transistor PT12 may be connected to the first node N1, and a drain of the second PMOS transistor PT12 may be connected to the first node N1. A drain of the first NMOS transistor NT11 may be connected to the first node N1, a gate of the first NMOS transistor NT11 may receive the reference voltage VREF, and a source of the first NMOS transistor NT11 may be connected to a third node N3. A drain of the second NMOS transistor NT12 may be connected to the third node N3, a gate of the second NMOS transistor NT12 may receive the feedback voltage VF through a seventh node N7, and a source of the second NMOS transistor NT12 may receive a ground voltage GND. In an exemplary embodiment, the size of the first PMOS transistor PT11 may be substantially the same as the size of the second PMOS transistor PT12. That is, a current driving power of the first PMOS transistor PT11 may be substantially the same as a current driving power of the second PMOS transistor PT12.

The first and second PMOS transistors PT11 and PT12 operate as a current mirror circuit. The first and second PMOS transistors PT11 and PT12 may generate the first current I1 by copying a reference current IVREF flowing from the drain of the first NMOS transistor NT11 to the source of the first NMOS transistor NT11. The reference current IVREF and the first current I1 may correspond to the reference voltage VREF, respectively. The size of the feedback voltage VF is proportional to the size of the reference current IVREF and the first current I1.

The second current generator 112 may include a third PMOS transistor PT13, a fourth PMOS transistor PT14, a third NMOS transistor NT13, and a fourth NMOS transistor NT14.

A source of the third PMOS transistor PT13 may receive a supply voltage VDD, a gate of the third PMOS transistor PT13 may be connected to a fourth node N4, a drain of the third PMOS transistor PT13 may be connected to a fifth node N5, and the drain of the third PMOS transistor PT13 may output the second current I2. A source of the fourth PMOS transistor PT14 may receive the supply voltage VDD, a gate of the fourth PMOS transistor PT14 may be connected to the fourth node N4, and a drain of the fourth PMOS transistor PT14 may be connected to the fourth node N4. A drain of the third NMOS transistor NT13 may be connected to the fourth node N4, a gate of the third NMOS transistor NT13 may receive the input limit voltage VINMAX, and a source of the third NMOS transistor NT13 may be connected to a sixth node N6. A drain of the fourth NMOS transistor NT14 may be connected to the sixth node N6, a gate of the fourth NMOS transistor NT14 may receive the feedback voltage VF through the seventh node N7, and a source of the fourth NMOS transistor NT14 may receive a ground voltage GND. In an exemplary embodiment, the size of the third PMOS transistor PT13 may be about half of the size of the fourth PMOS transistor PT14. That is, a current driving power of the third PMOS transistor PT13 may be about half of a current driving power of the fourth PMOS transistor PT14.

The third and fourth PMOS transistors PT13 and PT14 operate as a current mirror circuit. The third and fourth PMOS transistors PT13 and PT14 may generate the second current I2, which has a size equal to about half of the limit current IVINMAX flowing from the drain of the third NMOS transistor NT13 to the source of the third NMOS transistor NT13. The limit current IVINMAX and the second current I2 may correspond to the input limit voltage VINMAX, respectively. The size of the feedback voltage VF is proportional to the size of the limit current IVINMAX and the second current I2.

Figure 3:
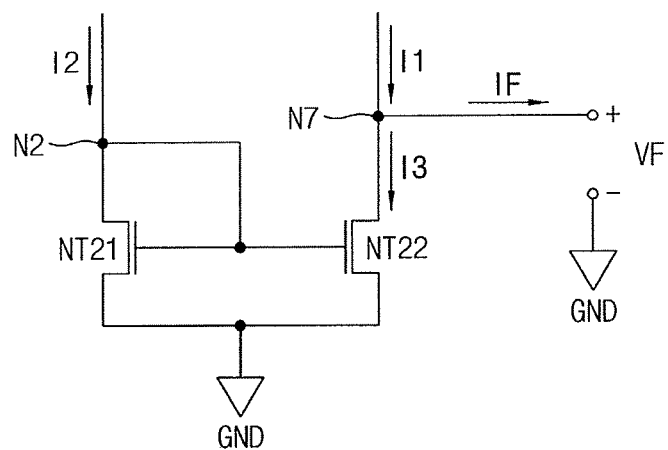
FIG. 3 is a circuit diagram illustrating the comparator included in the buffer circuit of FIG. 1 according to an exemplary embodiment of the inventive concept.

FIG. 3 is a circuit diagram illustrating the comparator included in the buffer circuit of FIG. 1 according to an exemplary embodiment of the inventive concept.

Referring to FIG. 3, the comparator 120 may include first and second NMOS transistors NT21 and NT22. The second current I2 may be provided to a second node N2. A drain of the first NMOS transistor NT21 may be connected to the second node N2, a gate of the first NMOS transistor NT21 may be connected to the second node N2, and a source of the first NMOS transistor NT21 may receive a ground voltage GND. The first current I1 may be provided to the seventh node N7. A drain of the second NMOS transistor NT22 may be connected to the seventh node N7, a gate of the second NMOS transistor NT22 may be connected to the second node N2, and a source of the second NMOS transistor NT22 may receive the ground voltage GND.

The third current I3 may flow from the drain of the second NMOS transistor NT22 to the source of the second NMOS transistor NT22. Since the size of the first NMOS transistor NT21 is substantially the same as the size of the second NMOS transistor NT22 (e.g., since the current driving power of the first NMOS transistor NT21 is substantially the same as the current driving power of the second NMOS transistor NT22), the size of the third current I3 is about equal to the size of the second current I2 (e.g., the amount of the third current I3 and the second current I2 is substantially the same). The feedback current IF, which is calculated by subtracting the third current I3 from the first current I1, may be outputted from the seventh node N7. The feedback current IF may be inputted to gates of the second and fourth NMOS transistors NT12 and NT14.

When the first current I1 is larger than the second current I2, the feedback current IF has a positive value and the comparator 120 may increase the feedback voltage VF until the first and second current generators 111 and 112 generate the first and second currents I1 and I2 such that the first and second currents I1 and I2 are substantially the same as each other.

When the first current I1 is smaller than the second current I2, the feedback current IF has a negative value and the comparator 120 may decrease the feedback voltage VF until the first and second current generators 111 and 112 generate the first and second currents I1 and I2 such that the first and second currents I1 and I2 are substantially the same as each other.

When the size of the first current I1 is substantially the same as the size of the second current I2, the comparator 120 stops changing the feedback voltage VF, and the feedback voltage VF remains the same.

Figure 4:
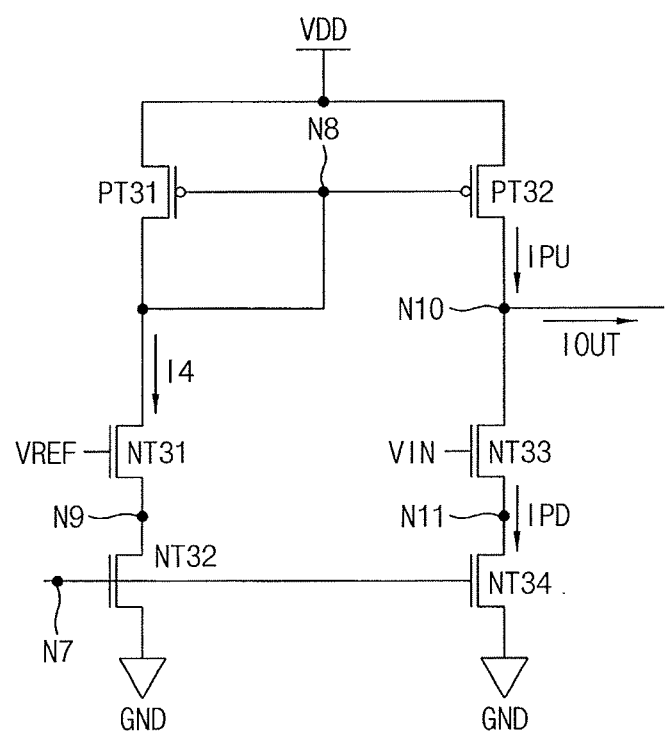
FIG. 4 is a circuit diagram illustrating the differential driver included in the buffer circuit of FIG. 1 according to an exemplary embodiment of the inventive concept.

FIG. 4 is a circuit diagram illustrating the differential driver included in the buffer circuit of FIG. 1 according to an exemplary embodiment of the inventive concept.

Referring to FIG. 4, the differential driver 140 may include a first PMOS transistor PT31, a second PMOS transistor PT32, and first through fourth NMOS transistors NT31, NT32, NT33, and NT34.

A source of the first PMOS transistor PT31 may receive a supply voltage VDD, a gate of the first PMOS transistor PT31 may be connected to the eighth node N8, and a drain of the first PMOS transistor PT31 may be connected to the eighth node N8. A drain of the first NMOS transistor NT31 may be connected to the eighth node N8, a gate of the first NMOS transistor NT31 may receive the reference voltage VREF, and a source of the first NMOS transistor NT31 may be connected to a ninth node N9. A drain of the second NMOS transistor NT32 may be connected to the ninth node N9, a gate of the second NMOS transistor NT32 may receive the feedback voltage VF through a seventh node N7, and a source of the second NMOS transistor NT32 may receive a ground voltage GND. A source of the second PMOS transistor PT32 may receive the supply voltage VDD, a gate of the second PMOS transistor PT32 may be connected to the eighth node N8, and a drain of the second PMOS transistor PT32 may be connected to a tenth node N10. The internal current IOUT may be outputted from the tenth node N10. A drain of the third NMOS transistor NT33 may be connected to the tenth node N10, a gate of the third NMOS transistor NT33 may receive the input voltage signal VIN, and a source of the third NMOS transistor NT33 may be connected to an eleventh node N11. A drain of the fourth NMOS transistor NT34 may be connected to the eleventh node N11, a gate of the fourth NMOS transistor NT34 may receive the feedback voltage VF through the seventh node N7, and a source of the fourth NMOS transistor NT34 may receive the ground voltage GND.

The first PMOS transistor PT31, the first NMOS transistor NT31, and the second NMOS transistor NT32 operate in the same manner as the second PMOS transistor PT12, the first NMOS transistor NT11, and the second NMOS transistor NT12 of FIG. 2. Thus, the fourth current I4, which flows from the drain of the first NMOS transistor NT31 to the source of the first NMOS transistor NT31, is about equal to the reference current IVREF of FIG. 2. The first and second PMOS transistors PT31 and PT32 operate as a current mirror circuit. The first and second PMOS transistors PT31 and PT32 generate a pull-up current IPU, which flows from the source of the second PMOS transistor PT32 to the drain of the second PMOS transistor PT32, by copying the fourth current I4. Since the size of the first PMOS transistor PT31 is substantially the same as the size of the second PMOS transistor PT32 (e.g., since a current driving power of the first PMOS transistor PT31 is substantially the same as a current driving power of the second PMOS transistor PT32), the size of the pull-up current IPU is about equal to the size of the first current I1.

When the input voltage signal VIN has the input limit voltage VINMAX, the second PMOS transistor PT32, the third NMOS transistor NT33, and the fourth NMOS transistor NT34 operate in the same manner as the fourth PMOS transistor PT14, the third NMOS transistor NT13, and the fourth NMOS transistor NT14. As a result, a pull-down current IPD which flows from the drain of the third NMOS transistor NT33 to the source of the third NMOS transistor NT33 is about equal to the limit current IVINMAX of FIG. 2, and the size of the pull-down current IPD is about double the size of the first current I1 of FIG. 2. In this case, an absolute value of the internal current IOUT is about the same as an absolute value of the first current I1, and the internal current IOUT may be negative. That is, the differential driver 140 may generate the internal current IOUT having a lower limit value.

When the input voltage signal VIN has the ground voltage GND, the third NMOS transistor NT33 is turned off and the pull-down current IPD is about 0 amps. In this case, the absolute value of the internal current IOUT is about the same as the absolute value of the first current I1, and the internal current IOUT may be positive. That is, the differential driver 140 may generate the internal current IOUT having an upper limit value.

Figure 5:
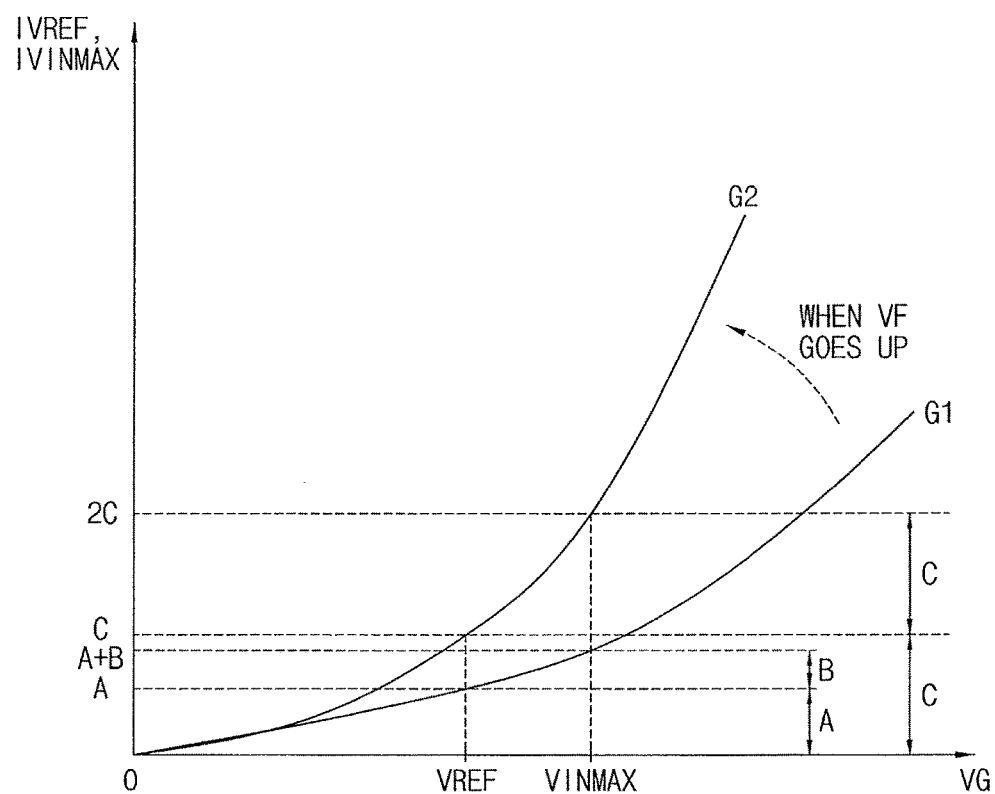
FIG. 5 is a graph illustrating an operation change of the current generator of FIG. 2 when the feedback current increases, according to an exemplary embodiment of the inventive concept.

FIG. 5 is a graph illustrating an operation change of the current generator of FIG. 2 when the feedback current increases, according to an exemplary embodiment of the inventive concept.

Referring to FIG. 5, a first graph GI illustrates a relationship between the reference voltage VREF applied to the gate of the first NMOS transistor NT11 and the reference current IVREF before the feedback voltage VF increases. The first graph G1 also illustrates a relationship between the input limit voltage VINMAX applied to the gate of the third NMOS transistor NT13 and the limit current IVINMAX before the feedback voltage VF increases.

In the first graph G1, the first current I1 has a value of A, the limit current IVINMAX has a value of A+B (A and B are positive rational numbers respectively, and A>B), and the second current I2 has a value of (A+B)/2 which is half of the limit current IVINMAX. Since the first current I1 is larger than the second current I2, the comparator 120 increases the feedback voltage VF until the first and second current generators 111 and 112 generate the first and second currents I1 and I2 such that the first and second currents I1 and I2 have substantially the same size C.

The second graph G2 illustrates a relationship between the reference voltage VREF applied to the gate of the first NMOS transistor NT11 and the reference current IVREF after the feedback voltage VF increases. The second graph G2 also illustrates a relationship between the input limit voltage VINMAX applied to the gate of the third NMOS transistor NT13 and the limit current IVINMAX after the feedback voltage VF increases.

In the second graph G2, the first current I1 has a value of C, the limit current IVINMAX has a value of 2C (C is a positive rational number, and B<C), and the second current I2 has a value of C, which is half of the limit current IVINMAX. Since the first current I1 is substantially the same as the second current I2, the comparator 120 does not change the feedback voltage VF.

Figure 6:
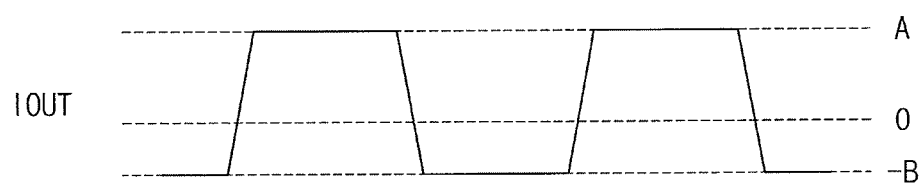
FIG. 6 is a timing diagram illustrating the internal current of the differential driver of FIG. 4 before the feedback voltage increases, according to an exemplary embodiment of the inventive concept.

FIG. 6 is a timing diagram illustrating the internal current of the differential driver of FIG. 4 before the feedback voltage increases, according to an exemplary embodiment of the inventive concept.

FIG. 6 shows an operation of the differential driver 140 operating according to the first graph G1 of FIG. 5 before the feedback voltage VF increases. The pull-up current IPU has a value of A, which is about equal to the first current I1. The pull-down current IPD has a value of about 0 amps when the input voltage signal VIN has the ground voltage GND. The pull-down current IPD has a value of A+B, which is about equal to the limit current IVINMAX when the input voltage signal VIN has the input limit voltage VINMAX. Since the internal current IOUT has a value of A when the input voltage signal VIN has the ground voltage GND, and since the internal current IOUT has a value of −B when the input voltage signal VIN has the input limit voltage VINMAX, the duty cycle of the output current BIOUT deteriorates.

FIG. 7 is a timing diagram illustrating the internal current of the differential driver of FIG. 4 after the feedback voltage increases, according to an exemplary embodiment of the inventive concept.

FIG. 7 shows an operation of the differential driver 140 operating according to the second graph G2 of FIG. 5 after the feedback voltage VF increases. The pull-up current IPU has a value of C, which is about equal to the first current I1. The pull-down current IPD has a value of 0 when the input voltage signal VIN has the ground voltage GND. The pull-down current IPD has a value of 2C, which is about equal to the limit current IVINMAX, when the input voltage signal VIN has the input limit voltage VINMAX. Since the internal current IOUT has a value of C when the input voltage signal VIN has the ground voltage GND, and since the internal current IOUT has a value of −C when the input voltage signal VIN has the input limit voltage VINMAX, the duty cycle of the output current BIOUT is improved by, for example, about 50%.

Figure 8:
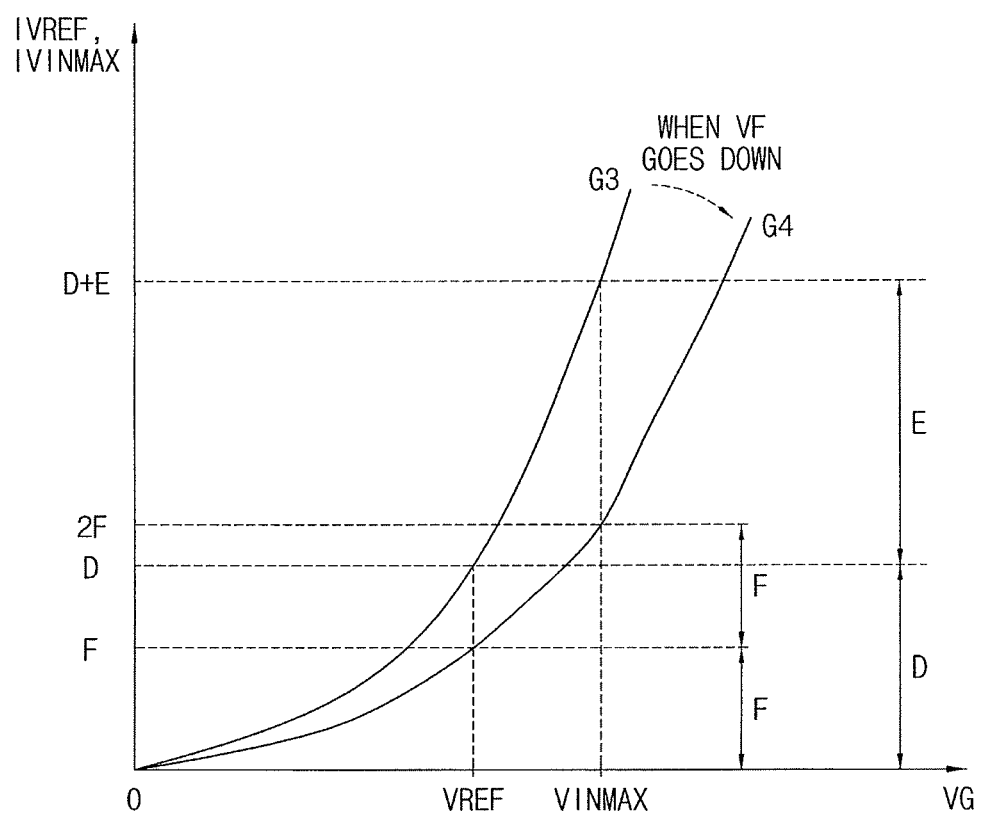
FIG. 8 is a graph illustrating an operation change of the current generator of FIG. 2 when the feedback current decreases, according to an exemplary embodiment of the inventive concept.

FIG. 8 is a graph illustrating an operation change of the current generator of FIG. 2 when the feedback current decreases, according to an exemplary embodiment of the inventive concept.

Referring to FIG. 8, a third graph G3 illustrates a relationship between the reference voltage VREF applied to the gate of the first NMOS transistor NT11 and the reference current IVREF before the feedback voltage VF decreases. The third graph G3 also illustrates a relationship between the input limit voltage VINMAX applied to the gate of the third NMOS transistor NT13 and the limit current IVINMAX before the feedback voltage VF decreases.

In the third graph G3, the first current I1 has a value of D, the limit current IVINMAX has a value of D+E (D and E are positive rational numbers respectively, and D<E), and the second current I2 has a value of (D+E)/2 which is half of the limit current IVINMAX. Since the first current I1 is smaller than the second current I2, the comparator 120 decreases the feedback voltage VF until the first and second current generators 111 and 112 generate the first and second currents I1 and I2 such that the first and second currents I1 and I2 have the same size F.

A fourth graph G4 illustrates a relationship between the reference voltage VREF applied to the gate of the first NMOS transistor NT11 and the reference current IVREF after the feedback voltage VF decreases. The fourth graph G4 also illustrates a relationship between the input limit voltage VINMAX applied to the gate of the third NMOS transistor NT13 and the limit current IVINMAX after the feedback voltage VF decreases.

In the fourth graph G4, the first current I1 has a value of F, the limit current IVINMAX has a value of 2F (F is a positive rational number, and F<D), the second current I2 has a value of F, which is half of the limit current IVINMAX. Since the first current I1 is substantially the same as the second current I2, the comparator 120 does not change the feedback voltage VF.

Figure 9:
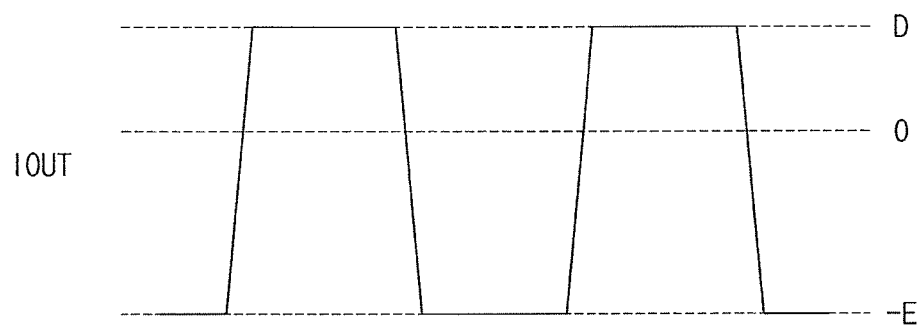
FIG. 9 is a timing diagram illustrating the internal current of the differential driver of FIG. 4 before the feedback voltage decreases, according to an exemplary embodiment of the inventive concept.

FIG. 9 is a timing diagram illustrating the internal current of the differential driver of FIG. 4 before the feedback voltage decreases, according to an exemplary embodiment of the inventive concept.

FIG. 9 illustrates the operation of the differential driver 140 operating according to the third graph G3 of FIG. 8 before the feedback voltage VF decreases. The pull-up current IPU has a value of D, which is equal to the first current I1. The pull-down current IPD has a value of 0 when the input voltage signal VIN has the ground voltage GND. The pull-down current IPD has a value of D+E, which is equal to the limit current IVINMAX when the input voltage signal VIN has the input limit voltage VINMAX. Since the internal current IOUT has a value of D when the input voltage signal VIN has the ground voltage GND, and since the internal current IOUT has a value of −E when the input voltage signal VIN has the input limit voltage VINMAX, the duty cycle of the output current BIOUT deteriorates.

Figure 10:
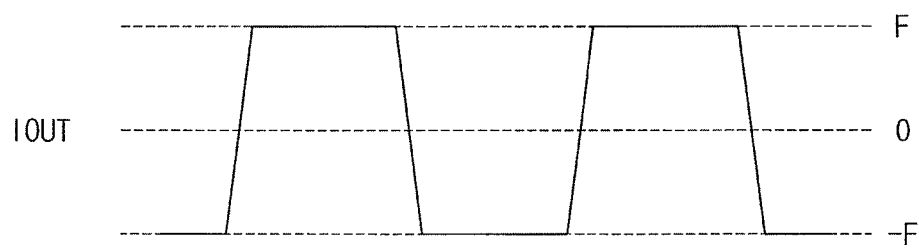
FIG. 10 is a timing diagram illustrating the internal current of the differential driver of FIG. 4 after the feedback voltage decreases, according to an exemplary embodiment of the inventive concept.

FIG. 10 is a timing diagram illustrating the internal current of the differential driver of FIG. 4 after the feedback voltage decreases, according to an exemplary embodiment of the inventive concept.

FIG. 10 illustrates the operation of the differential driver 140 operating according to the fourth graph G4 of FIG. 8 after the feedback voltage VF decreases. The pull-up current IPU has a value of F, which is equal to the first current I1. The pull-down current IPD has a value of 0 when the input voltage signal VIN has the ground voltage GND. The pull-down current IPD has a value of 2F, which is equal to the limit current IVINMAX, when the input voltage signal VIN has the input limit voltage VINMAX. Since the internal current IOUT has a value of F when the input voltage signal VIN has the ground voltage GND, and since the internal current IOUT has a value of −F when the input voltage signal VIN has the input limit voltage VINMAX, the duty cycle of the output current BIOUT is improved, for example, by about 50%.

Figure 11:
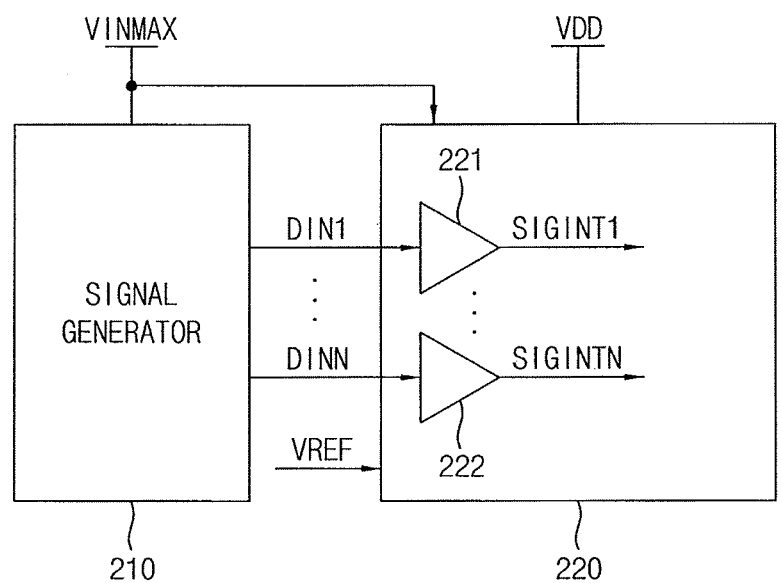
FIG. 11 is a block diagram illustrating an electric system according to an exemplary embodiment of the inventive concept.

FIG. 11 is a block diagram illustrating an electric system according to an exemplary embodiment of the inventive concept.

Referring to FIG. 11, an electric system 200 includes a signal generator 210 and a receiver 220. The receiver 220 includes first through (N)-th buffer circuits 221 and 222 (N is a natural number).

The signal generator 210 generates first through (N)-th input signals DIN1 through DINN based on an input limit voltage VINMAX. The first through (N)-th buffer circuits 221 and 222 convert the first through (N)-th input signals DIN1 through DINN to first through (N)-th output current signals SIGINT1 through SIGINTN based on the input limit voltage VINMAX and a reference voltage VREF respectively.

The first buffer circuit 221 includes, for example, a first current generator, a second current generator, a comparator, a differential driver, and an inverter. The first current generator outputs a first current corresponding to the reference voltage VREF. The size of the first current (e.g., the amount of the first current) is controlled by a feedback voltage. The second current generator generates a limit current corresponding to the input limit voltage VINMAX. The size of the limit current (e.g., the amount of the limit current) is controlled by the feedback voltage. The second current generator outputs a second current which is equal to about half of the limit current. The comparator generates the feedback voltage by comparing the first and second currents. The differential driver generates an internal current signal by comparing the first input signal DIN1 and the reference voltage VREF. The differential driver controls the internal current signal based on the feedback voltage such that an upper limit value of the internal current signal and a lower limit value of the internal current signal are symmetric with respect to a reference value (e.g., about 0 amps) (e.g., the magnitude of the upper limit value and the lower limit value are substantially equal to each other). The inverter generates the first output current signal SIGINT1 by inverting the internal current signal based on the supply voltage VDD. The operation of the first buffer circuit 221 may be understood further based on the description herein with reference to FIGS. 1 through 10.

Other buffer circuits in the electric system 200 may be the same as the first buffer circuit 221 as described herein.

Figure 12:
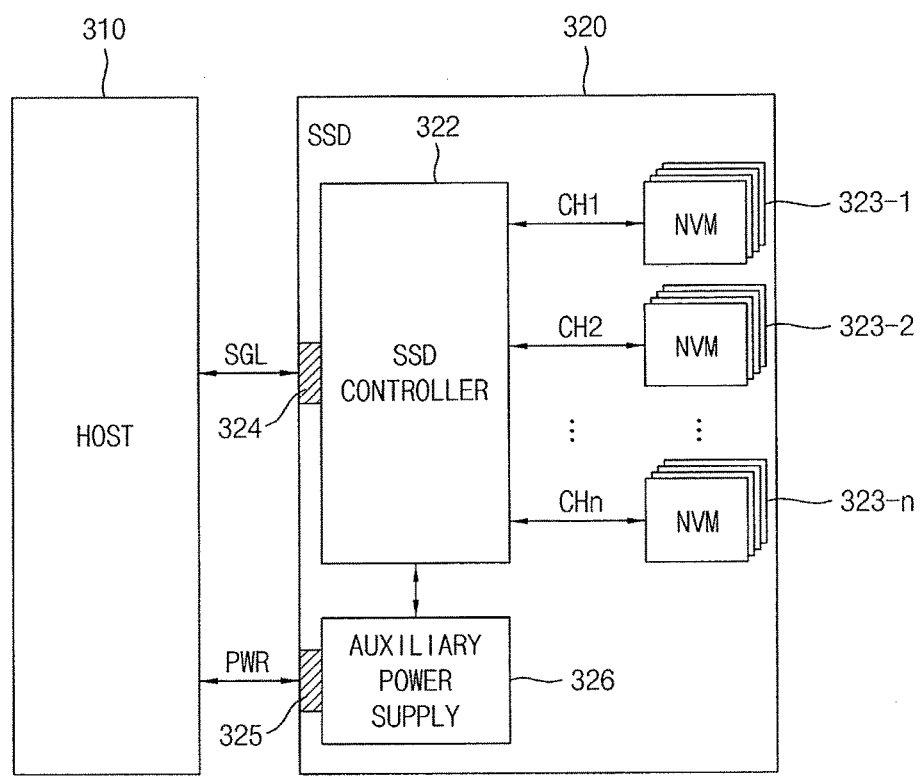
FIG. 12 is a block diagram illustrating a solid state drive (SSD) system according to an exemplary embodiment of the inventive concept.

FIG. 12 is a block diagram illustrating a solid state drive (SSD) system according to an exemplary embodiment of the inventive concept.

Referring to FIG. 12, an SSD system 300 includes a host 310 and an SSD 320. The SSD 320 includes first through n-th non-volatile memory devices 323-1, 323-2, . . . , 323-n and an SSD controller 322. Here, n represents an integer greater than or equal to two. The first through n-th non-volatile memory devices 323-1, 323-2, . . . , 323-n may be used as a storage medium of the SSD 320.

Each of the first through n-th non-volatile memory devices 323-1, 323-2, . . . , 323-n may include a memory cell array formed on a substrate in a three-dimensional structure. Memory cells included in the memory cell array may be formed in a direction perpendicular to the substrate. The memory cells included in the memory cell array may be connected to a plurality of word lines, which are stacked in a direction perpendicular to the substrate, and a plurality of bit lines, which are formed in a direction parallel to the substrate.

The SSD controller 322 is coupled to the first through n-th non-volatile memory devices 323-1, 323-2, . . . , 323-n by first through n-th channels CH1 CH2, . . . , CHn, respectively. The host 310 and the signal connector 324 may include a plurality of buffer circuits for transmitting a signal SGL, respectively. The buffer circuits may be implemented, for example, as the buffer circuit 100 of FIG. 1. The signal SGL may include a command, an address, data, etc.

The SSD controller 322 may perform a program operation and a read operation on the first through n-th non-volatile memory devices 323-1, 323-2, . . . , 323-n according to the command received from the host 310. The SSD controller 322 and the first through n-th non-volatile memory devices 323-1, 323-2, . . . , 323-n may include a plurality of buffer circuits for transmitting data, respectively. The buffer circuits may be implemented as, for example, the buffer circuit 100 of FIG. 1.

The SSD 320 may further include an auxiliary power supply 326. The auxiliary power supply 326 may receive power PWR from the host 310 through a power connector 325 and provide power to the SSD controller 322. The auxiliary power supply 326 may be placed inside or outside the SSD 320. For example, the auxiliary power supply 326 may be placed in a main board and provide auxiliary power to the SSD 320.

Figure 13:
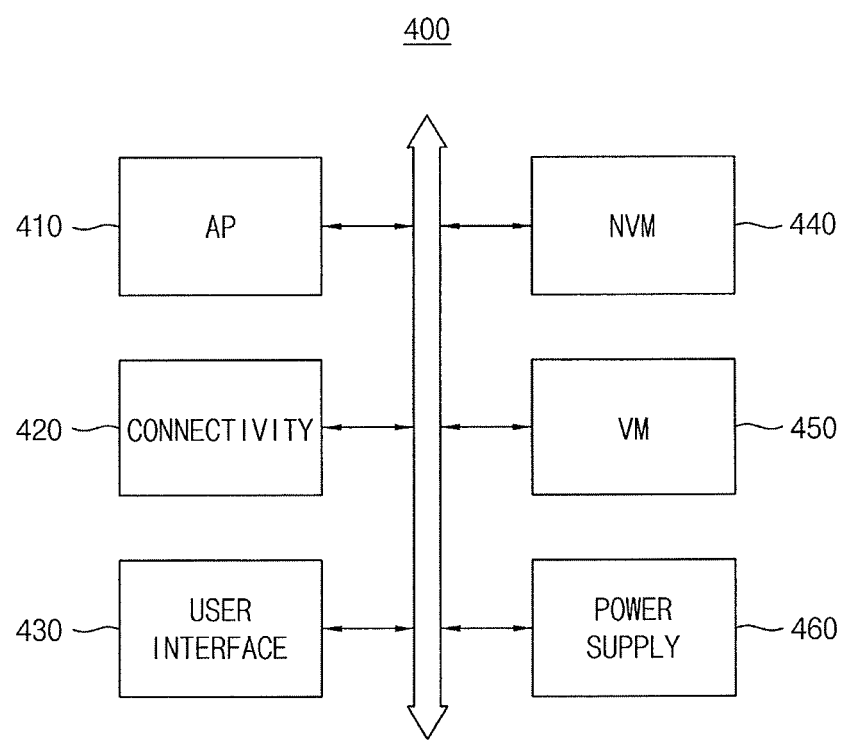
FIG. 13 is a block diagram illustrating a mobile system according to an exemplary embodiment of the inventive concept.

FIG. 13 is a block diagram illustrating a mobile system according to an exemplary embodiment of the inventive concept.

Referring to FIG. 13, a mobile system 400 includes an application processor AP 410, a connectivity unit 420, a user interface 430, a non-volatile memory device NVM 440, a volatile memory device VM 450 and a power supply 460.

In exemplary embodiments, the mobile system 400 may be, for example, a mobile phone, a smartphone, a personal digital assistant (PDA), a portable multimedia player (PMP), a digital camera, a music player, a portable game console, a navigation system, etc.

The application processor 410 may execute applications such as, for example, a web browser, a game application, a video player, etc. In exemplary embodiments, the application processor 410 may include a single core or multiple cores. For example, the application processor 410 may be a multi-core processor, such as a dual-core processor, a quad-core processor, a hexa-core processor, etc. The application processor 410 may include an internal or external cache memory.

The connectivity unit 420 may perform wired or wireless communication with an external device. For example, the connectivity unit 420 may perform Ethernet communication, near field communication (NFC), radio frequency identification (RFID) communication, mobile telecommunication, memory card communication, universal serial bus (USB) communication, etc. In exemplary embodiments, the connectivity unit 420 may include a baseband chipset that supports communications such as, for example, global system for mobile communications (GSM), general packet radio service (GPRS), wideband code division multiple access (WCDMA), high speed downlink/uplink packet access (HSxPA), etc.

The non-volatile memory device 440 may store a boot image for booting the mobile system 400.

The non-volatile memory device 440 may include, for example, a memory cell array formed on a substrate in a three-dimensional structure. Memory cells included in the memory cell array may be formed in a direction perpendicular to the substrate. The memory cells included in the memory cell array may be connected to a plurality of word lines, which are stacked in a direction perpendicular to the substrate, and a plurality of bit lines, which are formed in a direction parallel to the substrate.

The volatile memory device 450 may store data processed by the application processor 410, or may operate as a working memory.

The user interface 430 may include at least one input device such as, for example, a keypad, a touch screen, etc., and at least one output device such as, for example, a speaker, a display device, etc.

The power supply 460 may supply a power supply voltage to the mobile system 400.

The application processor 410, the connectivity unit 420, the user interface 430, the non-volatile memory device 440, and the volatile memory device 450 may include a plurality of buffer circuits for transmitting signal respectively. The buffer circuits may be implemented, for example, as the buffer circuit 100 of FIG. 1.

In exemplary embodiments, the mobile system 400 may further include, for example, an image processor, and/or a storage device, such as a memory card, a solid state drive (SSD), a hard disk drive (HDD), a CD-ROM, etc.

In exemplary embodiments, the mobile system 400 and/or components of the mobile system 400 may be packaged in various forms such as, for example, package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 14:
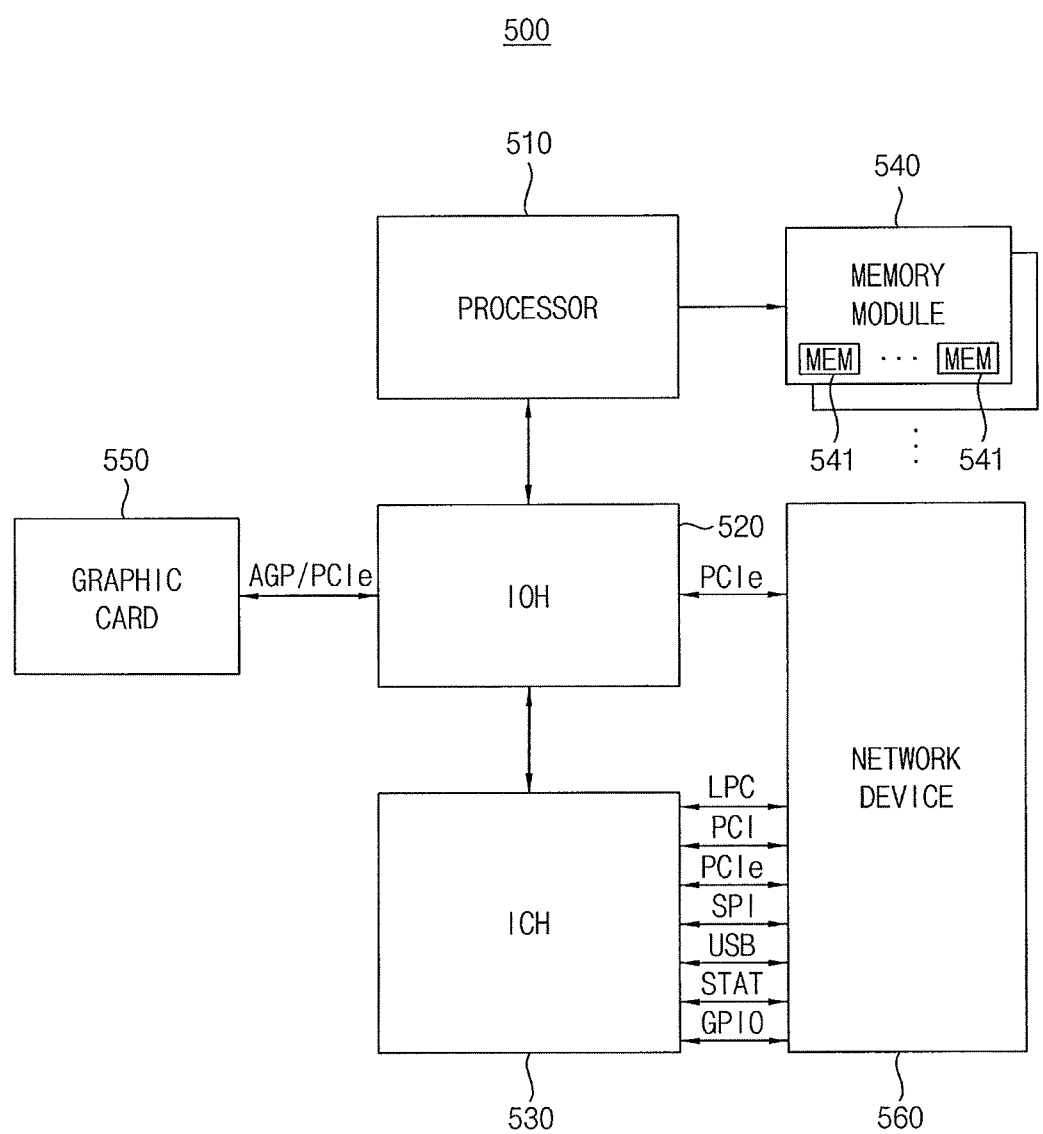
FIG. 14 is a block diagram illustrating a computing system according to an exemplary embodiment of the inventive concept.

FIG. 14 is a block diagram illustrating a computing system according to an exemplary embodiment of the inventive concept.

Referring to FIG. 14, a computing system 500 includes a processor 510, an input/output hub (IOH) 520, an input/output controller hub (ICH) 530, at least one memory module 540, a network device 560 and a graphics card 550. In exemplary embodiments, the computing system 500 may be, for example, a personal computer (PC), a server computer, a workstation, a laptop computer, a mobile phone, a smartphone, a personal digital assistant (PDA), a portable multimedia player (PMP), a digital camera, a digital television, a set-top box, a music player, a portable game console, a navigation system, etc.

The processor 510 may perform various computing functions, such as, for example, executing specific software for performing specific calculations or tasks. For example, the processor 510 may be a microprocessor, a central process unit (CPU), a digital signal processor, etc. In exemplary embodiments, the processor 510 may include a single core or multiple cores. For example, the processor 510 may be a multi-core processor, such as a dual-core processor, a quad-core processor, a hexa-core processor, etc. Although FIG. 14 illustrates the computing system 500 including one processor 510, in exemplary embodiments, the computing system 500 may include a plurality of processors.

The processor 510 may include a memory controller for controlling operations of the memory module 540. The memory controller included in the processor 510 may be referred to as an integrated memory controller (IMC). A memory interface between the memory controller and the memory module 540 may be implemented with a single channel including a plurality of signal lines, or may bay be implemented with multiple channels, to each of which at least one memory module 540 may be coupled. In exemplary embodiments, the memory controller may be located inside the input/output hub 520. The input/output hub 320 including the memory controller may be referred to as memory controller hub (MCH).

The memory module 540 may include a plurality of memory devices 541 that store data provided from the memory controller.

The input/output hub 520 may manage data transfer between the processor 510 and devices such as the graphics card 550. The input/output hub 520 may be coupled to the processor 510 via various interfaces. For example, the interface between the processor 510 and the input/output hub 520 may be a front side bus (FSB), a system bus, a HyperTransport, a lightning data transport (LDT), a QuickPath interconnect (QPI), a common system interface (CSI), etc. The input/output hub 320 may provide various interfaces with the devices. For example, the input/output hub 320 may provide an accelerated graphics port (AGP) interface, a peripheral component interface-express (PCIe), a communications streaming architecture (CSA) interface, etc. Although FIG. 14 illustrates the computing system 500 including one input/output hub 520, in exemplary embodiments, the computing system 500 may include a plurality of input/output hubs.

The graphics card 550 may be coupled to the input/output hub 520 via, for example, AGP or PCIe. The graphics card 550 may control a display device for displaying an image. The graphics card 550 may include an internal processor for processing image data and an internal memory device. In exemplary embodiments, the input/output hub 520 may include an internal graphics device along with or instead of the graphics card 550 outside of the graphics card 550. The graphics device included in the input/output hub 520 may be referred to as integrated graphics. Further, the input/output hub 520 including the internal memory controller and the internal graphics device may be referred to as a graphics and memory controller hub (GMCH).

The input/output controller hub 530 may perform data buffering and interface arbitration to efficiently operate various system interfaces. The input/output controller hub 530 may be coupled to the input/output hub 520 via an internal bus, such as a direct media interface (DMI), a hub interface, an enterprise Southbridge interface (ESI), PCIe, etc.

The input/output controller hub 530 may provide various interfaces with peripheral devices. For example, the input/output controller hub 530 may provide a universal serial bus (USB) port, a serial advanced technology attachment (SATA) port, a general purpose input/output (GPIO), a low pin count (LPC) bus, a serial peripheral interface (SPI), PCI, PCIe, etc.

The network device 560 may receive data of the processor 510 and the graphics card 550 through the PCI express connection of the input/output hub 520, or one of the USB port, the SATA port, the GPIO, the LPC bus, the SPI, the PCI, and the PCIe. The network device 560 may transmit the data to the other computing system. The network device 560 may receive other data from the other computing system.

The processor 510, the input/output hub 520, the input/output controller hub 530, the least one memory module 540, the network device 560, and the graphics card 550 may include a plurality of buffer circuits for transmitting signal. The buffer circuits may be implemented, for example, as the buffer circuit 100 of FIG. 1.

In exemplary embodiments, the processor 510, the input/output hub 520 and the input/output controller hub 530 may be implemented as separate chipsets or separate integrated circuits. In exemplary embodiments, at least two of the processor 510, the input/output hub 520 and the input/output controller hub 530 may be implemented as a single chipset.

According to exemplary embodiments of the inventive concept, a buffer circuit having a pull-up driving power that is substantially the same as its pull-down current driving power is provided, which may improve the duty cycle by, for example, about 50%.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A buffer circuit, comprising:
a first current generator configured to output a first current corresponding to a reference voltage, wherein a feedback voltage is input to the first current generator from a comparator, and a size of the first current is controlled by the feedback voltage;
a second current generator configured to generate a limit current corresponding to an input limit voltage, wherein the feedback voltage is input to the second current generator from the comparator, a size of the limit current is controlled by the feedback voltage, and the second current generator is configured to output a second current having a size equal to about half of the limit current;
the comparator configured to generate the feedback voltage by comparing the first and second currents;
a differential driver configured to generate an internal current by comparing an input voltage signal and the reference voltage, and control the internal current based on the feedback voltage, wherein a magnitude of an upper limit value of the internal current and a magnitude of a lower limit value of the internal current are substantially equal to each other with respect to a reference value; and
an inverter configured to generate an output current by inverting the internal current based on a supply voltage.

2. The buffer circuit of claim 1, wherein the input voltage signal varies between a ground voltage and the input limit voltage.

3. The buffer circuit of claim 1, wherein the first and second currents are each proportional to the feedback voltage.

4. The buffer circuit of claim 1, wherein, in response to the first current being larger than the second current, the comparator increases the feedback voltage until the first and second currents are about equal to each other.

5. The buffer circuit of claim 1, wherein, in response to the first current being smaller than the second current, the comparator decreases the feedback voltage until the first and second currents are about equal to each other.

6. The buffer circuit of claim 1, wherein the internal current generated by the differential driver is about equal to the lower limit value when the input voltage signal is larger than the reference voltage, and the internal current generated by the differential driver is about equal to the upper limit value when the input voltage signal is smaller than the reference voltage.

7. The buffer circuit of claim 1, wherein an absolute value of the upper limit value is about equal to an absolute value of the lower limit value.

8. The buffer circuit of claim 1, wherein the first current generator comprises a first .PMOS transistor, a second PMOS transistor, a first NMOS transistor, and a second NMOS transistor,
wherein a source of the first PMOS transistor receives the supply voltage, a gate of the first PMOS transistor is connected to a first node, and a drain of the first PMOS transistor outputs the first current,
wherein a source of the second PMOS transistor receives the supply voltage, a gate of the second PMOS transistor is connected to the first node, and a drain of the second PMOS transistor is connected to the first node,
wherein a drain of the first NMOS transistor is connected to the first node, a gate of the first NMOS transistor receives the reference voltage, and a source of the first NMOS transistor is connected to a second node,
wherein a drain of the second NMOS transistor is connected to the second node, a gate of the second NMOS transistor receives the feedback voltage, and a source of the second NMOS transistor receives a ground voltage.

9. The buffer circuit of claim 8, wherein a current driving power of the first PMOS transistor is about equal to a current driving power of the second PMOS transistor.

10. The buffer circuit of claim 1, wherein the second current generator comprises a first PMOS transistor, a second PMOS transistor, a first NMOS transistor, and a second NMOS transistor,
wherein a source of the first PMOS transistor receives the supply voltage, a gate of the first PMOS transistor is connected to a first node, and a drain of the first PMOS transistor outputs the second current,
wherein a source of the second PMOS transistor receives the supply voltage, a gate of the second PMOS transistor is connected to the first node, and a drain of the second PMOS transistor is connected to the first node,
wherein a drain of the first NMOS transistor is connected to the first node, a gate of the first NMOS transistor receives the input limit voltage, a source of the first NMOS transistor is connected to a second node, and the limit current flows from the drain of the first NMOS transistor to the source of the first NMOS transistor,
wherein a drain of the second NMOS transistor is connected to the second node, a gate of the second NMOS transistor receives the feedback voltage, and a source of the second NMOS transistor receives a ground voltage.

11. The buffer circuit of claim 10, wherein a current driving power of the first PMOS transistor is about half of a current driving power of the second PMOS transistor.

12. The buffer circuit of claim 1, wherein the comparator comprises a first NMOS transistor and a second NMOS transistor,
wherein the second current is provided to a first node,
wherein a drain of the first NMOS transistor is connected to the first node, a gate of the first NMOS transistor is connected to the first node, and a source of the first NMOS transistor receives a ground voltage,
wherein the first current is provided to a second node,
wherein a drain of the second NMOS transistor is connected to the second node, a gate of the second NMOS transistor is connected to the first node, and a source of the second NMOS transistor receives the ground voltage,
wherein a voltage of the second node is outputted as the feedback voltage.

13. The buffer circuit of claim 1, wherein the differential driver comprises a first PMOS transistor, a second PMOS transistor, a first NMOS transistor, a second NMOS transistor, a third NMOS transistor and a fourth NMOS transistor,
wherein a source of the first PMOS transistor receives the supply voltage, a gate of the first PMOS transistor is connected to a first node, and a drain of the first PMOS transistor is connected to the first node,
wherein a drain of the first NMOS transistor is connected to the first node, a gate of the first NMOS transistor receives the reference voltage, and a source of the first NMOS transistor is connected to a second node,
wherein a drain of the second NMOS transistor is connected to the second node, a gate of the second NMOS transistor receives the feedback voltage, and a source of the second NMOS transistor receives a ground voltage,
wherein a source of the second PMOS transistor receives the supply voltage, a gate of the second PMOS transistor is connected to the first node, and a drain of the second PMOS transistor is connected to a third node,
wherein the internal current is outputted from the third node,
wherein a drain of the third NIVIOS transistor is connected to the third node, a gate of the third NMOS transistor receives the input voltage signal, and a source of the third NMOS transistor is connected to a fourth node,
wherein a drain of the fourth NMOS transistor is connected to the fourth node, a gate of the fourth NMOS transistor receives the feedback voltage, and a source of the fourth NMOS transistor receives the ground voltage.

14. An electric system, comprising:
a signal generator configured to generate first through (N)-th input signals based on an input limit voltage, wherein N is a natural number; and
a receiver comprising first through (N)-th buffer circuits configured to respectively convert the first through (N)-th input signals to first through (N)-th output current signals based on the input limit voltage and a reference voltage,
wherein a (K)-th buffer circuit from among the first through (N)-th buffer circuits, wherein K is a natural number equal to or less than N, comprises:
a first current generator configured to output a first current corresponding to the reference voltage, wherein a size of the first current is controlled by a feedback voltage;
a second current generator configured to generate a limit current corresponding to the input limit voltage, wherein a size of the limit current is controlled by the feedback voltage, and the second current generator is configured to output a second current having a size equal to about half of the limit current;
a comparator configured to generate the feedback voltage by comparing the first and second currents;
a differential driver configured to generate an internal current signal by comparing a (K)-th input signal from among the first through (N)-th input signals and the reference voltage, and control the internal current signal based on the feedback voltage, wherein a magnitude of an upper limit value of the internal current signal and a magnitude of a lower limit value of the internal current signal are substantially equal to each other with respect to a reference value; and
an inverter configured to generate a (K)-th output current signal from among the first through (N)-th output current signals by inverting the internal current signal based on a supply voltage.

15. The electric system of claim 14, wherein, in response to the first current being larger than the second current, the comparator increases the feedback voltage until the first and second currents are about equal to each other,
wherein, in response to the first current being smaller than the second current, the comparator decreases the feedback voltage until the first and second currents are about equal to each other.

16. The electric system of claim 14, wherein the reference value is about 0 amps.

17. A buffer circuit, comprising:
a first current generator configured to output a first current corresponding to a reference voltage, wherein a size of the first current is controlled by a feedback voltage;
a second current generator configured to generate a limit current corresponding to an input limit voltage, wherein a size of the limit current is controlled by the feedback voltage, and the second current generator is configured to output a second current having a size equal to about half of the limit current;
a comparator configured to generate the feedback voltage by comparing the first and second currents, and output the feedback voltage directly from the comparator to each of the first current generator and the second current generator;
a differential driver configured to generate an internal current by comparing an input voltage signal and the reference voltage, and control the internal current based on the feedback voltage, wherein a magnitude of an upper limit value of the internal current and a magnitude of a lower limit value of the internal current are substantially equal to each other with respect to a reference value; and
an inverter configured to generate an output current by inverting the internal current based on a supply voltage,
wherein each of the first and second current generators comprises a first PMOS transistor, a second PMOS transistor, a first NMOS transistor, and a second NMOS transistor.

18. The buffer circuit of claim 17,
wherein a source of the first PMOS transistor of the first current generator receives the supply voltage, a gate of the first PMOS transistor of the first current generator is connected to a first node, and a drain of the first PMOS transistor of the first current generator outputs the first current,
wherein a source of the second PMOS transistor of the first current generator receives the supply voltage, a gate of the second PMOS transistor of the first current generator is connected to the first node, and a drain of the second PMOS transistor of the first current generator is connected to the first node,
wherein a drain of the first NMOS transistor of the first current generator is connected to the first node, a gate of the first NMOS transistor of the first current generator receives the reference voltage, and a source of the first NMOS transistor of the first current generator is connected to a second node,
wherein a drain of the second NMOS transistor of the first current generator is connected to the second node, a gate of the second NMOS transistor of the first current generator receives the feedback voltage, and a source of the second NMOS transistor of the first current generator receives a ground voltage.

19. The buffer circuit of claim 18,
wherein a source of the first PMOS transistor of the second current generator receives the supply voltage, a gate of the first PMOS transistor of the second current generator is connected to a third node, and a drain of the first PMOS transistor of the second current generator outputs the second current, wherein a source of the second PMOS transistor of the second current generator receives the supply voltage, a gate of the second PMOS transistor of the second current generator is connected to the third node, and a drain of the second PMOS transistor of the second current generator is connected to the third node, wherein a drain of the first NMOS transistor of the second current generator is connected to the third node, a gate of the first NMOS transistor of the second current generator receives the input limit voltage, a source of the first NMOS transistor of the second current generator is connected to a fourth node, and the limit current flows from the drain of the first NMOS transistor of the second current generator to the source of the first NMOS transistor of the second current generator, wherein a drain of the second NMOS transistor of the second current generator is connected to the fourth node, a gate of the second NMOS transistor of the second current generator receives the feedback voltage, and a source of the second NMOS transistor of the second current generator receives the ground voltage.

20. The buffer circuit of claim 1, wherein the first current generator, the second current generator, and the comparator are directly connected to a same node, and the feedback voltage is input to the first current generator and the second current generator from the comparator via the same node.

* * * * *